United States Patent [19]

Patalong et al.

[11] 4,359,486
[45] Nov. 16, 1982

[54] METHOD OF PRODUCING ALLOYED METAL CONTACT LAYERS ON CRYSTAL-ORIENTATED SEMICONDUCTOR SURFACES BY ENERGY PULSE IRRADIATION

[75] Inventors: Hubert Patalong, Munich; Eberhard F. Krimmel, Pullach, both of Fed. Rep. of Germany

[73] Assignee: Siemens Aktiengesellschaft, Berlin & Munich, Fed. Rep. of Germany

[21] Appl. No.: 289,880

[22] Filed: Aug. 4, 1981

[30] Foreign Application Priority Data

Aug. 28, 1980 [DE] Fed. Rep. of Germany ....... 3032461
Dec. 4, 1980 [DE] Fed. Rep. of Germany ....... 3045784

[51] Int. Cl.³ .......................................... H01L 21/24
[52] U.S. Cl. .................... 427/53.1; 219/121 L; 219/121 LM; 357/15; 357/65; 427/88; 427/91
[58] Field of Search .......................... 427/53.1, 88, 91; 219/121 L, 121 LE, 121 LF, 121 LM; 357/15, 65

[56] References Cited

U.S. PATENT DOCUMENTS 4,261,764  4/1981  Narayan .................... 357/65

FOREIGN PATENT DOCUMENTS 2825212  3/1980  Fed. Rep. of Germany.

Primary Examiner—John H. Newsome
Attorney, Agent, or Firm—Hill, Van Santen, Steadman, Chiara & Simpson

[57] ABSTRACT

A region of a semiconductor surface intended for a metal contact is scanned with a closely packed sequence of intense laser light pulses so as to generate a disturbed surface layer and a metal layer is then applied and alloyed into the semiconductor surface. The invention is particularly useful with silicon crystal surfaces orientated in the <100> direction, which for the manufacture of semiconductor components, such as thyristors having controllable short-circuits generated by integrated field effect transistors, are provided on their back side with an aluminum contact or a metal silicide contact.

15 Claims, 8 Drawing Figures

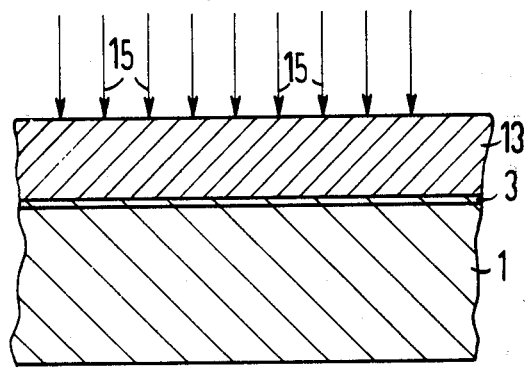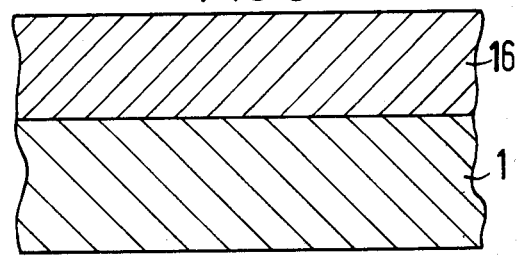

METHOD OF PRODUCING ALLOYED METAL CONTACT LAYERS ON CRYSTAL-ORIENTATED SEMICONDUCTOR SURFACES BY ENERGY PULSE IRRADIATION

BACKGROUND OF THE INVENTION

1. Field of the Invention

The invention relates to a method of producing alloyed metal contact layers on crystal-orientated semiconductor surfaces by energy pulse irradiation.

2. Prior Art

German Pat. No. 2,825,212 describes a process wherein extremely thin metal layers are applied to a semiconductor substrate by vapor-deposition, sputtering, electrolytic precipitation or ion implantation and such thin metal layers are then irradiated with intense short laser-like pulses so as to become alloyed with the semiconductor surface. In this process, the irradiation parameters must be selected in such a manner that no noticeable diffusion of metal into the substrate occurs. The pulse duration of the laser-like pulses, accordingly, must be in the nanosecond range. This known process is limited to manufacture of extremely thin metal structures as are utilized, for example, in VLSI technology.

In semiconductor technology, one generally selects the surfaces, for example, from silicon materials from which components are to be manufactured, in a plane of a specific privileged crystal orientation.

For example, future thyristors generated with the aid of integrated field effect transistors will contain controllable short-circuits. Accordingly, it is necessary to combine power semiconductor and MOS technology with one another. Typically, <111>-orientated silicon is employed in power semiconductor technology because of its good ability to alloy, while <100>-orientated silicon is utilized as the starting material in MOS technology because other crystal properties are considered more significant in this instance.

A further significant difference is that <100>silicon base material can be more easily drawn and homogeneously doped relative to <111>silicon. Thus, <100->silicon can be manufactured substantially more economically. The utilization of <100>-silicon would, therefore, also be more advantageous for the manufacture of power semiconductor components.

However, the use of <100>-orientated silicon for the manufacture of thyristors encounters difficulties in the alloying between metal layers and silicon. For example, an aluminum-silicon alloying in <100>-orientated silicon surfaces occurs very unevenly so that the negative inhibiting capacity is very different.

SUMMARY OF THE INVENTION

The invention provides a method of increasing the alloying readiness of a thin surface layer of a <100>-orientated silicon crystal wafer with respect to a contact metal, so that the entire surface can be alloyed-on at the very begining of an alloying operation and, thereby attain a uniform relatively thick alloy layer.

In accordance with the principles of the invention, before the application of a metal contact layer, that region of a semiconductor surface intended for a metal contact is scanned with a closely packed sequence of intense laser-light pulses so as to generate a disturbed surface layer and a metal layer is thereafter applied and alloyed into the semiconductor surface in a known manner.

In one embodiment of the invention, a silicon crystal surface orientated in the <100>-direction is utilized as the semiconductor surface and aluminum is utilized, for example, as the contact metal, which can be pressed on in the form of a foil. However, it is also possible to apply a layer consisting of at least one metal silicide as the contact material. Preferably, the metal silicides are selected from the group consisting of molybdenum, tungsten, titanium, tantalum, niobium, platinum and palladium silicides. Such metal silicides are applied by vapor-deposition or sputtering from a target containing a given metal silicide or from two sources each containing a respective component of a silicide onto a silicon surface which was previously scanned with an intense laser-light pulse and which is orientated in the <100>-direction. The subsequent allying-in can occur with the aid of a high temperature furnace or occur with the aid of laser pulse or electron beam irradiation. For example, alloying-in may occur with a continuous laser wave or by means of a surface-wide irradiation with a ruby pulse laser (20 nsec). In this process, the power is set as a function of the layer thickness.

According to an exemplary, presently preferred embodiment of the invention, a Nd;YAG pulse laser having a wave length of 1.06 $\mu$m, a pulse duration of 0.5 $\mu$s and an output in the range of about 50 watts is utilized as the scanning laser light pulse. In this embodiment, the light ray beam of the laser is focused to a diameter of about 50 $\mu$m and the semiconductor surface to be treated is scanned with a pulse frequency of 4 kilohertz by means of close adjacency of the individual beam cross-sections. The overall irradiation time for a <100>-orientated silicon crystal wafer approximately 7.5 cm in diameter, amounts to about 1 minute in this embodiment.

The principles of the invention can be explained as follows:

When a silicon surface is irradiated with a short laser-like pulse above a critical intensity, $I_{cr}$, then some silicon evaporates from the irradiated surface area. Thus, a small crater having the diameter of the laser beam is generated. When this area is cooled, a polycrystalline surface layer, interpenetrated by many dislocation lines, is formed, particularly at the edges of the crater. If the critical intensity, $I_{cr}$, is not exceeded by all too much, the network of dislocation lines remains limited to the surface layer.

The dense network of dislocation lines and the various orientations of the crystallines of the polycrystalline surface layer promote an etching of the silicon by aluminum, even with <100>-orientated silicon wafers, so that a uniform thin surface aluminum-silicon alloy layer is formed.

Electron beam difraction diagrams, in reflection, show the Kikuchi diagram of a perfect monocrystalline surface layer on the non-irradiated, rubbed, backside of a wafer. After laser irradiation in air, diffuse Debye-Scherrer rings become visible, which indicate a thin, not necessarily stoichiometric, oxide layer. This oxide layer is approximately 30 nm thick. After etching with hydrofluoric acid, individual Bragg reflexes superimposed with a Debye-Scherrer ring system, which derives from polycrystalline surface areas, appear. The bottoms of craters generated in this manner may be monocrystalline whereas the edges of such craters have a polycrystalline structure. Accordingly, the inventive process is all the more effective the more finely the laser light beam is focused and the more closely packed the individual irradiation spots are to one another.

In contrast to the method of alloying-on extremely thin structures as described in the earlier mentioned German Pat. No. 2,825,212, the inventive process is particularly suitable for manufacture of thicker alloy layers.

In embodiments of the invention where metal silicide layers are utilized as the contact material layers for semiconductor components, the ohmic resistance with respect, for example, to highly doped polycrystalline silicon layers, is reduced by a factor of 5 through 10. Further advantages are obtained due to the etching properties (good etching stop) of the silicide in the manufacture of components and to the high stability exhibited thereby given temperature loads.

BRIEF DESCRIPTION OF THE DRAWINGS

FIGS. 5 and 6 are somewhat similar view of another embodiment wherein molybdenum silicide layer is utilized as the contact metal.

DESCRIPTION OF PREFERRED EMBODIMENTS

Figure 1:
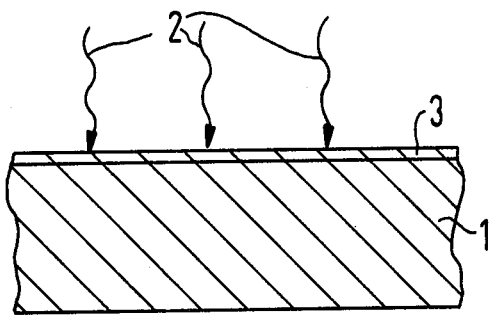
FIGS. 1-4 are elevated partial cross-sectional views of an exemplary embodiment, illustrating certain sequential steps in accordance with the principles of the invention wherein an aluminum layer is utilized as a contact material.

In the drawings, identical reference numerals denote identical elements and the individual method steps of the invention are schematically illustrated and briefly explained on the basis of exemplary embodiments.

In FIG. 1, a silicon crystal wafer 1 having a surface orientated in the <100>-direction is irradiated, in a scanning manner, with sharply focused, intense laser light pulses 2 so as to generate craters or the like in a thin surface layer 3. The surface layer 3 generally consists of an extensive network of disclocation lines and polycrystallines which no longer offer the subsequent alloying any resistance.

Figure 2:
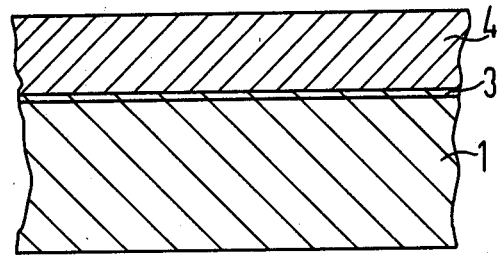
Figure 3:
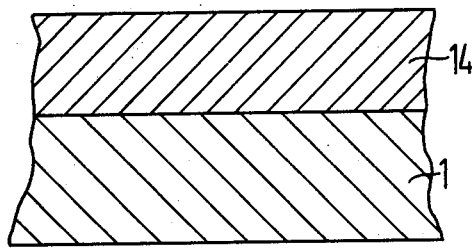
Figure 4:
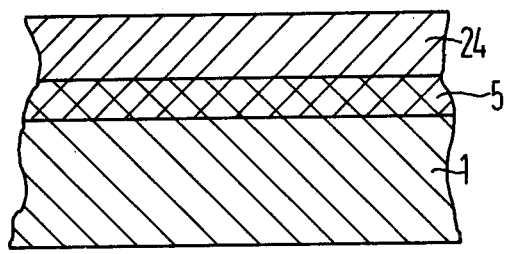

As can be seen from FIG. 2, an aluminum layer 4 is applied onto the disturbed surface layer 3, for example, by vapor-deposition, sputtering, electrolytic precipitation or, preferably, by means of pressing an aluminum foil onto such surface. The applied metal layer is then alloyed into the semiconductor body. Initially, during heating, an aluminum-silicon melt 14 is formed (FIG. 3). During cooling, the aluminum-silicon melt 14 is converted into an aluminum-silicon eutectic 24 and a p-conductive silicon layer 5, as shown in FIG. 4.

As shown at FIG. 5, a molybdenum silicide layer 13 (MoSi$_2$) is applied, for example, by sputtering, onto a disturbed surface layer 3 (cf. FIG. 1) and is then alloyed into the silicon crystal wafer 1. Such alloying occurs, for example, by means of laser irradiation, for example, by a surface-wide irradiation with a pulse laser, (schematically illustrated with arrows 15) whereby the power of the laser is set as a function of the layer thickness of the molybdenum silicide layer 13. Given a silicide layer thickness extending from a few tenths through a few hundreds of nanometers and given pulse irradiation, energy densities which have to be irradiated-in lie in the range from approximately 1 through 5 J·cm$^{-2}$ (Joule per square centimeter).

In this manner, after irradiation, a molybdenum-silicon eutectic 16 or various co-existing phases of silicides are formed on the silicon surface 1. Such eutectic or phases uniformly wet the silicon surface 1 orientated in the <100> direction.

Figure 7:
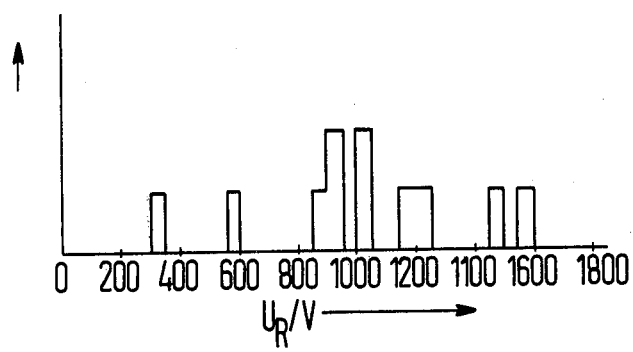
FIGS. 7 and 8 are graphical illustrations showing the improvement of electrical parameters achieved by the practice of the invention.
Figure 8:
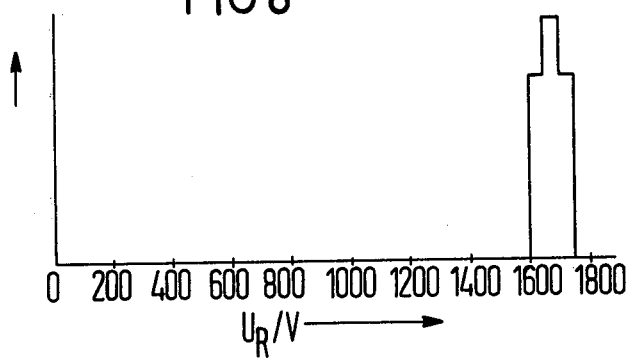

After implementation of the inventive method, the following results were achieved with respect to relevant electrical parameters:

Thyristors which contain controllable short-circuits generated by integrated field effect transistors were manufactured from <100>-silicon. A part of the <100>-orientated silicon wafers were subjected to the inventive laser treatment before alloying. The frequency of currents of a measured inhibiting capability, $U_R/V$, in a negative direction can be seen from the graphs shown at FIGS. 7 and 8. The inhibiting capability with untreated wafers (FIG. 7), as was already determined in earlier tests, is relatively poor. In contrast thereto, the negative inhibiting capability of laser-treated wafers (FIG. 8) is substantially improved and achieves the inhibiting capability of thyristors formed from <111>-orientated silicon. Accordingly, even <100>-orientated silicon can be alloyed with aluminum, when the silicon surface to be alloyed is first scanned with an appropriate laser light beam. No particular quality demands are made of the laser itself.

Due to the principles of the invention, one is able to better integrate MOS technology and bipolar technology.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In a method of producing alloyed metal contact layers on crystal-orientated semiconductor surfaces by means of pulsed energy irradiation, the improvement comprising wherein:
   prior to application of a metal contact layer, an area of a semiconductor surface intended for the metal contact is scanned with a dense sequence of relatively intense laser-light pulses,
   a metal layer is applied onto such scanned semiconductor surface area; and
   said metal layer is alloyed into said semiconductor surface area.

2. In a method as defined in claim 1 wherein said semiconductor surface is a silicon crystal surface orientated in the <100> direction and said metal contact layer is composed of aluminum.

3. In a method as defined in claim 2 wherein said aluminum contact layer is applied onto the scanned semiconductor surface area by pressing an aluminum foil onto such semiconductor surface area.

4. In a method as defined in claim 1 wherein said semiconductor surface is a silicon crystal surface orientated in the <100> direction and said metal contact layer is composed of at least one metal silicide.

5. In a method as defined in claim 4 wherein said metal silicide is selected from the group consisting of silicides of molybdenum, tungsten, titanium, tantalum, niobium, platinum and paladium.

6. In a method as defined in claim 4 wherein said metal silicide is applied by means of vapor-deposition.

7. In a method as defined in claim 4 wherein said metal silicide is applied by means of sputtering from a target which contains the metal silicide or from two targets which contain a respective component of the metal silicide.

8. In a method as defined in claim 4 wherein alloying occurs by laser or electron irradiation.

9. In a method as defined in claim 8 wherein alloying occurs by a surface-wide irradiation with a pulse laser, the power of which is set as a function of the thickness of the metal silicide layer.

10. In a method as defined in claim 1 wherein said scanning of an area of the semiconductor surface intended for the metal contact occurs with laser light pulses produced by a Nd:YAG pulse laser having a wavelength of 1.06 μm, a pulse duration of 0.5 μs and a power in the range of 50 watts.

11. In a method as defined in claim 10 wherein said pulse laser produces a light ray beam focused to a diameter of 50 μm and said semiconductor surface intended for metal contact is scanned with a pulse frequency of 4 kilohertz by a relatively close adjacency of individual ray cross-sections.

12. In a method as defined in claim 1 wherein said semiconductor surface is a silicon crystal surface orientated in the <100> direction and has a diameter of about 7.5 cm and said scanning of such semiconductor surface with said laser light pulses occurs in an overall irradiation time of about 1 minute.

13. In a method of producing semiconductor components having a crystal-orientated semiconductor material with a front surface and a back surface, with a metal contact layer on such back surface, the improvement comprising wherein:
   prior to application of a metal contact layer, said back surface is scanned with a dense sequence of relatively intense laser-light pulses;
   a metal layer is applied onto such scanned back surface; and
   said metal layer is alloyed into said back surface.

14. In a method as defined in claim 13 wherein said crystal-orientated semiconductor material is a silicon crystal having at least its back surface orientated in the <100> direction.

15. In a method as defined in claim 14 wherein said semiconductor component is a thyristor which contains controllable short-circuits generated by integrated field effect transistors.

* * * * *